(12) United States Patent
Root et al.

(10) Patent No.: US 8,698,515 B2
(45) Date of Patent: Apr. 15, 2014

(54) PROBE TEST EQUIPMENT FOR TESTING A SEMICONDUCTOR DEVICE

(75) Inventors: Bryan J. Root, Apple Valley, MN (US); William A. Funk, Eagan, MN (US)

(73) Assignee: Celadon Systems, Inc., Apple Valley, MN (US)

( * ) Notice: Subject to any disclaimer, the term of this patent is extended or adjusted under 35 U.S.C. 154(b) by 218 days.

(21) Appl. No.: 13/210,750

(22) Filed: Aug. 16, 2011

(65) Prior Publication Data

US 2012/0038380 A1 Feb. 16, 2012

Related U.S. Application Data

(60) Provisional application No. 61/374,108, filed on Aug. 16, 2010.

(51) Int. Cl.
*G01R 31/00* (2006.01)

(52) U.S. Cl.
USPC ............. 324/756.03; 324/754.07; 324/754.03

(58) Field of Classification Search
None
See application file for complete search history.

(56) References Cited

U.S. PATENT DOCUMENTS

| | | | | |
|---|---|---|---|---|
| 5,264,787 A | * | 11/1993 | Woith et al. | 324/750.25 |
| 5,416,429 A | * | 5/1995 | McQuade et al. | 324/754.07 |
| 6,060,892 A | * | 5/2000 | Yamagata | 324/754.07 |
| 6,114,869 A | * | 9/2000 | Williams et al. | 324/754.11 |
| 6,166,553 A | * | 12/2000 | Sinsheimer | 324/756.05 |
| 6,201,402 B1 | | 3/2001 | Root | |
| 6,586,954 B2 | | 7/2003 | Root | |
| 6,747,447 B2 | * | 6/2004 | Markert et al. | 324/750.19 |
| 6,956,386 B2 | * | 10/2005 | Kim et al. | 324/754.07 |
| 6,963,207 B2 | | 11/2005 | Root et al. | |
| 6,975,128 B1 | | 12/2005 | Root et al. | |
| 6,992,495 B2 | | 1/2006 | Root et al. | |
| 7,605,582 B2 | * | 10/2009 | Nguyen | 324/756.05 |
| 2007/0159194 A1 | * | 7/2007 | Hasegawa et al. | 324/754 |
| 2008/0315905 A1 | * | 12/2008 | Kuniyoshi et al. | 324/761 |
| 2009/0184725 A1 | * | 7/2009 | Tunaboylu | 324/754 |
| 2011/0204912 A1 | | 8/2011 | Root et al. | |

* cited by examiner

*Primary Examiner* — Richard Isla Rodas
(74) *Attorney, Agent, or Firm* — Hamre, Schumann, Mueller & Larson, P.C.

(57) ABSTRACT

A test apparatus is described that can be useful as test equipment in various applications, including for example testing a semiconductor device. The test apparatus has a circuit board, a probe card, and a card holder. The circuit board includes a contact layout that electrically connects with a probe card at one portion and electrically connects with a probe card holder at another portion. The probe card has probes for electrically contacting a device to be tested, and has a contact configuration that electrically connects with the circuit board. The apparatus allows for electrical signals to be sent to and from the probe card, through the probe card holder and circuit board, in testing a device such as for example a semiconductor device. The circuit board and probe card holder have an attachment structure, configured for example as a notch and catch finger attachment arrangement.

10 Claims, 4 Drawing Sheets

PROBE TEST EQUIPMENT FOR TESTING A SEMICONDUCTOR DEVICE

This application claims the benefit of U.S. Provisional Application Ser. No. 61/374,108, filed on Aug. 16, 2010, and titled "Electrical Testing Apparatus", the entirety of which is herewith incorporated by reference.

FIELD

The disclosure herein generally relates to an electrical testing apparatus. More particularly, the disclosure herein relates to probe test equipment for testing a semiconductor device.

BACKGROUND

The semiconductor industry continues to have a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA (Femto Ampere, e.g. $1 \times 10^{-15}$ Amp). In addition, the currents and device characteristics are often required to be evaluated over a wide temperature range to understand how temperature affects a device. Also, because of materials characteristics of dielectrics, it is often difficult to test characteristics of semiconductor devices in a wide operating temperature range.

To effectively measure at currents below 100 fA, a measurement signal must be isolated from external electrical interference, leakage currents through the dielectric material, parasitic capacitance, triboelectric noise, piezoelectric noise, and dielectric absorption, etc.

Accordingly, there continues to be a need for improved semiconductor test equipment, such as for instance electrically probing semiconductor devices, for example semiconductor wafers, at low currents over a wide temperature range. There is also a need to improve upon the connective and mounting equipment so as to optimize such diagnostic capabilities.

SUMMARY

The disclosure herein generally relates to electrical test equipment. Generally, an improved test apparatus is described herein that has a circuit board, a probe card, and a card holder. The apparatus shown and described herein can be useful as test equipment in various applications, including for example testing a semiconductor device, including but not limited to a semiconductor wafer or a micro-electrical-mechanical systems (MEMS) device.

In one embodiment, a test apparatus includes a circuit board that has a contact layout that electrically connects with a probe card at one portion and electrically connects with a probe card holder at another portion. The probe card has probes for electrically contacting a device to be tested or device under test (DUT), e.g. a semiconductor device(s). The probe card also has a contact configuration that electrically connects with the circuit board. The apparatus allows for signals to be sent to and from the probe card, through the probe card holder and circuit board, for testing a device, such as for example a semiconductor device. The circuit board and probe card holder have an attachment structure, arranged and configured for example as a notch and catch finger attachment.

BRIEF DESCRIPTION OF THE DRAWINGS

The drawings herein show inventive concepts of an electrical test apparatus.

DETAILED DESCRIPTION

Figure 1:
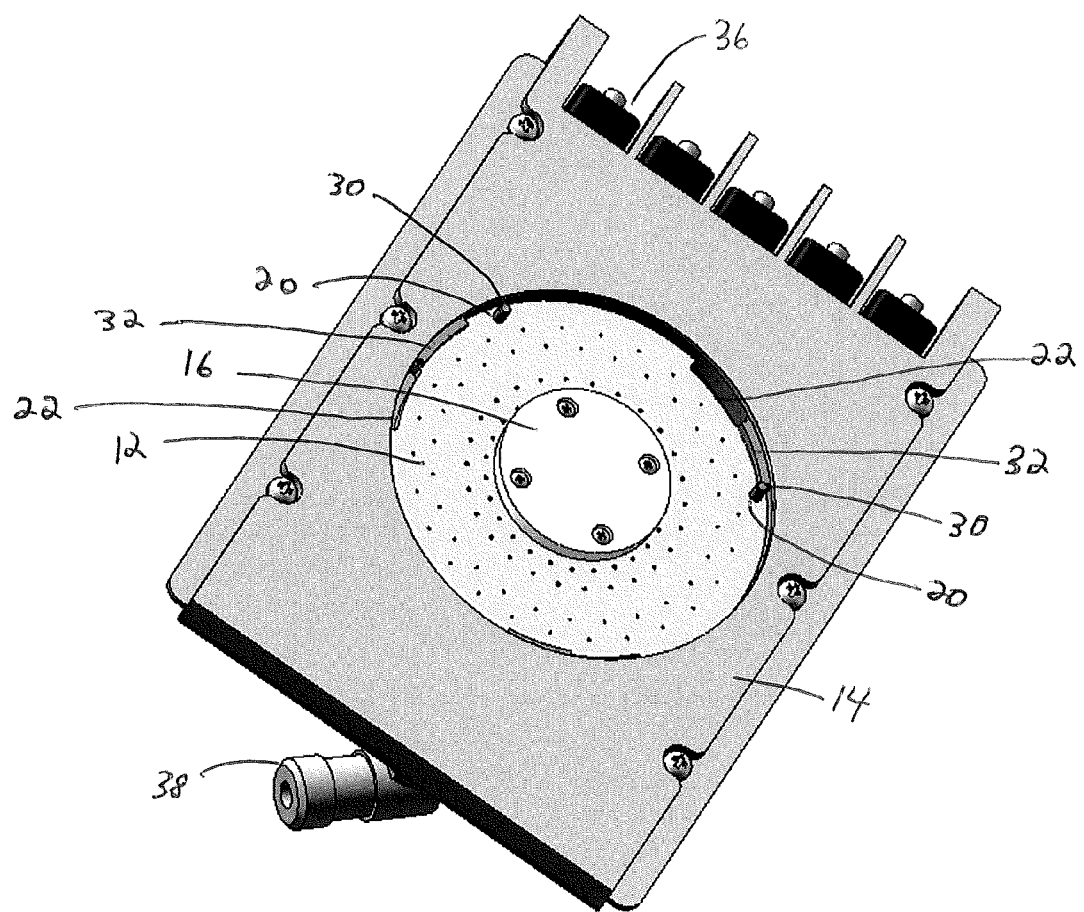
FIG. 1 is a bottom perspective view of one embodiment of a test apparatus.

Generally, an improved test apparatus is described herein. FIGS. 1-4 illustrate an exemplary embodiment of an electrical test apparatus 10. Generally, the apparatus 10 described herein can be useful in various applications, including for example testing a semiconductor device, including but not limited to semiconductor wafers and MEMS devices. It will be appreciated that, wherever appropriate, the test apparatus 10 shown and described herein may be suitably used to test equipment other than semiconductor devices.

In the embodiment shown, the test apparatus 10 includes a circuit board 12 that has a contact layout that electrically connects with a probe card 16 at one portion and electrically connects with a probe card holder 14 at another portion. See FIG. 4 for contact layout 26 as opposite side of contact pads of board 12 are shown in FIGS. 1 and 2.

Regarding the probe card 16, the probe card 16 can be removably connected to the circuit board, and is configured to electrically contact a device to be tested, and is configured to electrically connect with the circuit board 12. It will be appreciated that the probe card 16 has probes for electrically contacting a device to be tested or device under test (DUT), e.g. a semiconductor device(s). The probe card 16 also has a contact configuration that electrically connects with the circuit board 12. The probes and contact configuration are not shown, but such probe cards are known for example in probe tiles and cards such as those disclosed in U.S. patent application Ser. No. 13/010,234, filed on Jan. 20, 2011, and which is incorporated by reference. Such contact configurations of a probe could be suitably adapted to electrically connect with the circuit board 12. Further, probe wires of such known probe cards and tiles may be suitably adapted to electrically connect with a DUT. It will be appreciated that the configuration of probing wires, their characteristics and construction may vary. Applicants' previous patents, which discuss probe characteristics and constructions, include U.S. Pat. Nos. 6,975,128, 6,963,207, 6,992,495, 6,586,954, and 6,201,402, all of which are hereby incorporated by reference in their entirety, wherein one of skill in the art could use the subject matter described in these patents and apply it to probing wires, needles, tips, etc. of any probe test core described herein.

Generally, the apparatus 10 allows for signals to be sent to and from probe card 16, through the probe card holder 14 and circuit board 12, for testing a device, such as for example a semiconductor device. The circuit board 12 and probe card holder 14 have an attachment structure 22, 32, arranged and configured for example as a notch and catch finger attachment.

Figure 2:
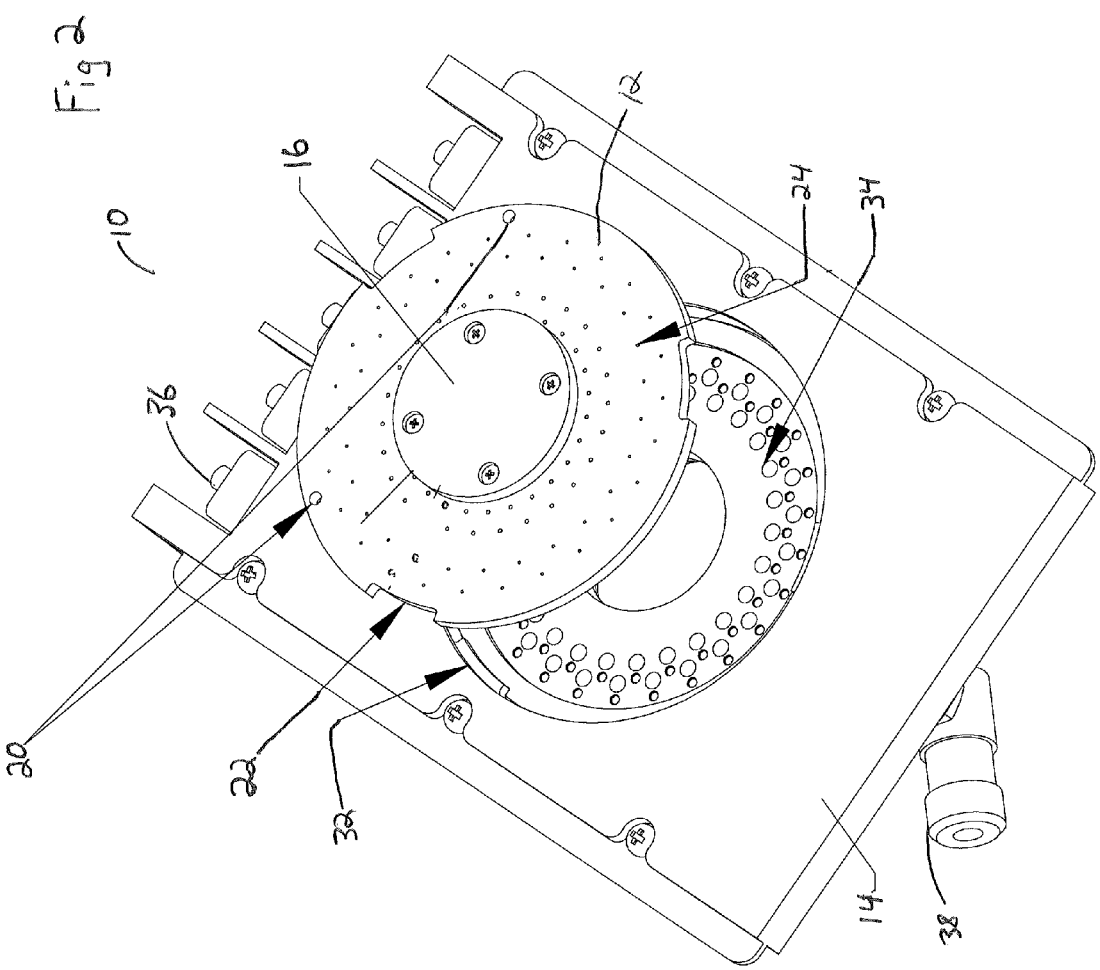
FIG. 2 is a bottom partially exploded view of the test apparatus of FIG. 1.
Figure 4:
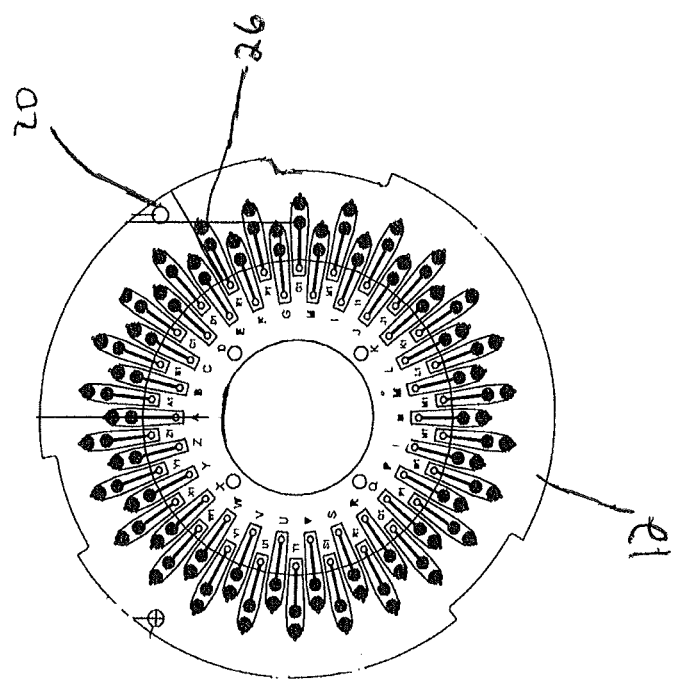
FIG. 4 is a top view of one embodiment of a circuit board with contact pads thereon.

With further reference to FIGS. 1 and 2, the circuit board 12 has an alignment feature in holes 20 that allow insertion of guide pins 30 on the probe card holder 14. The arrangement of the holes and pins allow for precise alignment of the circuit board 12 with the probe card holder 14. That is, the contacts of the circuit board 12 and the contacts of the probe card holder 14 can be correctly aligned after assembly. In the embodiment shown, contact pins 34 or spring pins of the probe card holder 14 would coincide with contact pads on the circuit board (reverse of pads 24 shown in FIGS. 1 and 2. FIG. 4 shows an embodiment of contact pads 26 of circuit board 12.

With reference to the attachment arrangement between the probe card holder 14 and the circuit board 12, a notch and catch finger structure is employed for easy attachment and convenient detachment of the circuit board 12 from the probe card holder 14. In the embodiment shown, the circuit board 12 has notches 22 that coincide with catch fingers 32 on the probe card holder 14. In one embodiment, the notches 22 and catch fingers 32 allow for a twist lock connection of the circuit board 12 with the probe card holder 14. The alignment features 20, 30 allow for correctly aligning the contacts of the respective components when assembled.

Figure 3:
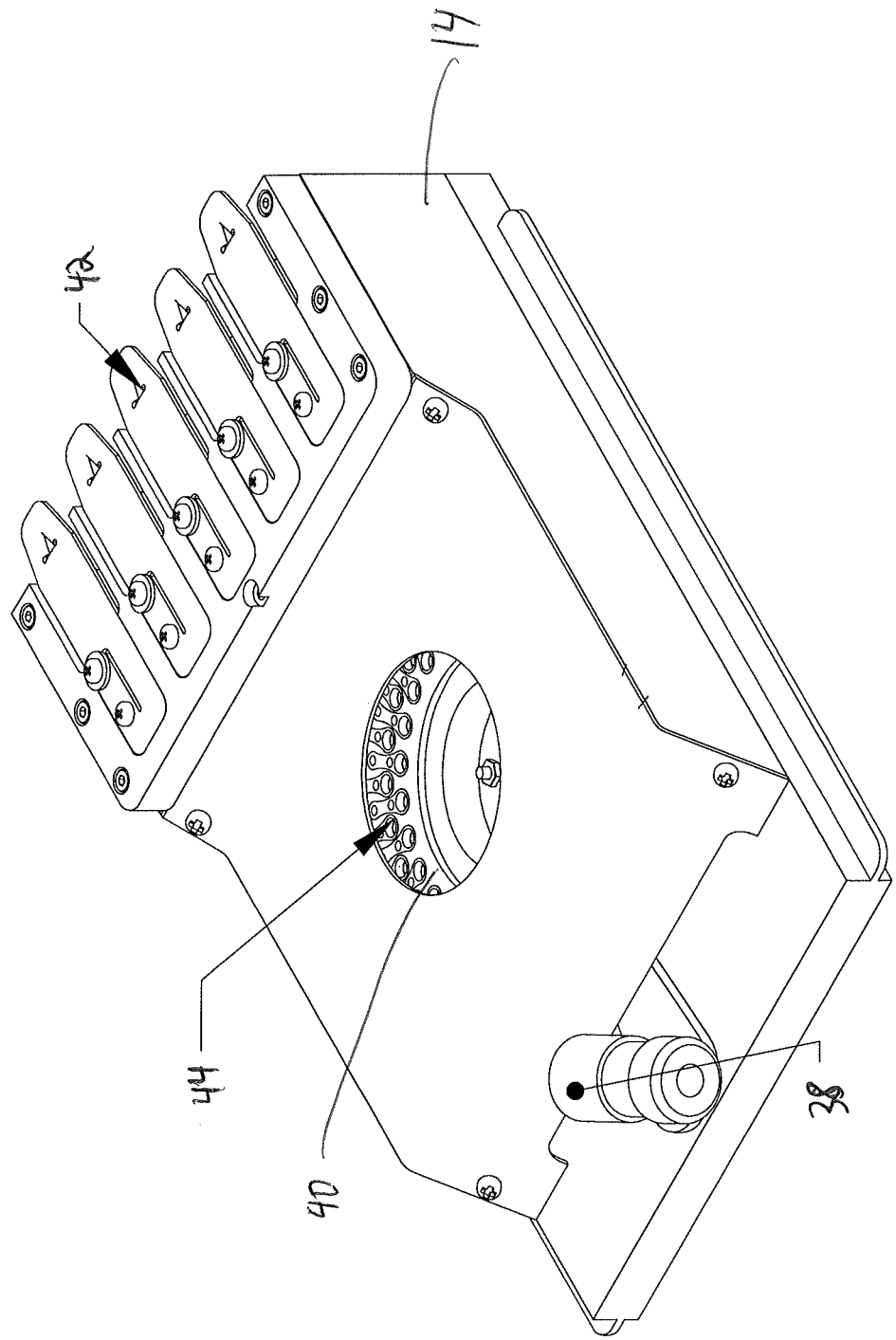
FIG. 3 is a top perspective view of one embodiment of a probe card holder shown in FIG. 1.

With reference to FIG. 3, the probe card holder 14 has a main body or frame. Cable latches 42 are provided to allow for connection of the test apparatus 10 to a testing equipment that performs the diagnostic test(s). Contact area 36 allows for electrical connection of the apparatus 10 to such diagnostic equipment that may be used. Signals can be sent to and from probe card 16, through the probe card holder 14 and circuit board 12, for testing a device, such as for example a semiconductor device. In the embodiment shown, the probe card holder 14 also has a signal path 44 at pins 34, which may be a fully guarded signal path, in transmitting the signals to and from the circuit board 12 and probe card 16. An opening 40 allows for a probe card, e.g. probe card 16, to be inserted and connected to the circuit board 12 or replaced. In some embodiments, a device 38, such as a ball joint can be used for remote actuation of a probe card clamp to hold the probe card in place.

The numerous innovative teachings of the present application have been set forth above with particular reference to presently preferred but exemplary embodiments, wherein these innovative teachings are advantageously applied, for example to the particular problems of a probe needle for measuring low currents with a wide operating temperature range in probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The following terms have been particularly described throughout the description and are not intended to be limitative:

Semiconductor Device not Limitive

The present disclosure is particularly suitable for probing semiconductor devices, but the use of the present teachings is not limited to probing semiconductor devices. Other devices may be applied to the present invention teachings. Thus, while this specification speaks in terms of probing 'semiconductor' devices, this term should be interpreted broadly to include probing any suitable device.

Low Current not Limitive

The present disclosure can solve the problem of measuring currents below 100 fA, but the current range of the present teachings is not limited to below 100 fA. For example, the present invention may be applied to measure the currents at or above 100 fA in a semiconductor device. Thus, while this specification speaks in terms of 'low currents' or 'measuring currents below 100 fA', these terms should be interpreted broadly to include any current that flows through a semiconductor device which could be at or above 100 fA. In a grounded guard controlled impedance configuration the present invention also solves the problem of measuring high frequency signals at high temperatures.

Wide Temperature not Limitive

The present disclosure can solve the problem of measuring currents of a semiconductor device in a narrow or limited operating temperature range. The present teachings do not limit to a specific operating temperature range. The present application allows a tester to electrically probe semiconductor devices over a wide operating temperature range, not only at a low operating temperature but also a high operating temperature, e.g. an operating temperature up to 300° C. and beyond. Thus, while this specification speaks in terms of 'wide temperature range' or 'measuring currents in a wide operating temperature range', these terms should be interpreted broadly to include any suitable operating or testing temperature range of a semiconductor device.

Probe not Limitive

The present disclosure can solve the problem of measuring currents of a semiconductor device using a shielded probe, for example a co-axial shielded probe as known. However, nothing in the teachings of the present invention limits application of the teachings of the present invention to a probe needle with more or less layers if appropriate and/or desired. Advantageous use of the teachings herein may be had with a probe needle of any number of layers.

Size not Limitive

The present disclosure can solve the problem of measuring currents and voltages of a semiconductor device using a compact probing apparatus. However, nothing in the teachings of the present invention limits application of the teachings of the present invention to a larger or smaller probe apparatus. Advantageous use of the teachings of the present invention may be had with a probe apparatus of any size.

Materials not Limitive

It will be appreciated that the teachings herein do not recognize any limitations in regards to what types of materials may be used in affecting the teachings of the present invention. One skilled in the art will recognize that any suitable material may be used with no loss of generality in implementing the teachings of the present invention.

The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

The invention claimed is:

1. An electrical probe apparatus comprising
a circuit board;
a probe card removably connected to the circuit board; and
a probe card holder, the circuit board and the probe card holder having an attachment structure, the circuit board being connectable to the probe card holder via the attachment structure, and the attachment structure including a first attachment element disposed on the circuit board, and a second attachment element disposed on the probe card holder and configured to engage the first attachment element,
the circuit board includes a contact layout configured to electrically connect with the probe card at one portion and configured to electrically connect with the probe card holder at another portion, and the apparatus is adapted to allow electrical signals to be sent to and from the probe card, through the probe card holder and the circuit board, in testing a device.

2. The electrical probe apparatus of claim 1, wherein the attachment structure is arranged and configured as a notch and catch finger attachment.

3. The electrical probe apparatus of claim 1, further comprising an alignment feature.

4. The electrical probe apparatus of claim 3, wherein the alignment feature comprises a guide pin disposed on the probe card holder being insertable through a hole of the circuit board.

5. The electrical probe apparatus of claim 1, wherein the probe card holder includes a frame, the frame having a cable latch thereon, the frame having a contact area adapted to electrically connect the apparatus to a diagnostic equipment, and the frame having an opening, the opening configured to allow insertion and replacement of the probe card.

6. The electrical probe apparatus of claim 1, further comprising a ball joint configured to allow remote actuation of a device adapted to hold the probe card in place.

7. The electrical probe apparatus of claim 1, wherein the contact layout of the circuit board is configured to electrically connect with contact pins of the probe card holder, the probe card holder including a signal path.

8. The electrical probe apparatus of claim 1, wherein the probe card holder includes an opening configured to allow insertion and replacement of the probe card, and the contact layout is disposed around the opening when the circuit board is connected to the probe card holder.

9. The electrical probe apparatus of claim 1, wherein the attachment structure is configured to provide a twist lock connection of the circuit board and the probe card holder.

10. An electrical probe apparatus comprising:
a circuit board;
a probe card; and
a probe card holder,
the circuit board includes a contact layout configured to electrically connect with the probe card at one portion and configured to electrically connect with the probe card holder at another portion,
the apparatus is adapted to allow electrical signals to be sent to and from the probe card, through the probe card holder and the circuit board, in testing a device, and
the circuit board and the probe card holder have an attachment structure arranged and configured as a notch and catch finger attachment, the notch is disposed on the circuit board and the catch finger is disposed on the probe card holder, and the notch and catch finger are adapted to allow for a twist lock connection of the circuit board with the probe card holder.

* * * * *